US009935251B1

(12) United States Patent
Johnson et al.

(10) Patent No.: US 9,935,251 B1
(45) Date of Patent: Apr. 3, 2018

(54) LED CHIP PACKAGING WITH HIGH PERFORMANCE THERMAL DISSIPATION

(71) Applicant: Hutchinson Technology Incorporated, Hutchinson, MN (US)

(72) Inventors: Keith D. Johnson, Hutchinson, MN (US); Peter F. Ladwig, Hutchinson, MN (US); Michael W. Davis, Rockford, MN (US); Dean E. Myers, Stewart, MN (US); Douglas P. Riemer, Waconia, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 14/212,900

(22) Filed: Mar. 14, 2014

Related U.S. Application Data

(60) Provisional application No. 61/790,460, filed on Mar. 15, 2013.

(51) Int. Cl.
*H01L 33/62* (2010.01)
*H01L 33/64* (2010.01)

(52) U.S. Cl.
CPC ............ *H01L 33/644* (2013.01); *H01L 33/62* (2013.01); *H01L 33/641* (2013.01); *H01L 33/648* (2013.01)

(58) Field of Classification Search
CPC .................. H01L 33/62; H01L 33/64–33/648
See application file for complete search history.

(56) References Cited

U.S. PATENT DOCUMENTS

| 2004/0222433 A1* | 11/2004 | Mazzochette | H01L 25/0753 257/99 |
| 2008/0093606 A1* | 4/2008 | Pan | H01L 24/97 257/81 |
| 2009/0010011 A1* | 1/2009 | Tseng et al. | 362/373 |
| 2012/0012880 A1* | 1/2012 | Lee et al. | 257/98 |
| 2012/0074455 A1* | 3/2012 | Lu | H01L 33/642 257/99 |

* cited by examiner

*Primary Examiner* — Yu Chen
(74) *Attorney, Agent, or Firm* — Nixon Peabody LLP

(57) ABSTRACT

An LED package and method of manufacture. An embodiment of the LED package includes a metal base having a cavity, a flexible circuit on the base, a dielectric layer in the cavity, and an LED chip having a bottom side facing the base and electrically coupled to the flexible circuit. The LED chip is powered by current flowing through the flexible circuit, and heat generated by the LED chip is conducted to the base through the flexible circuit and the dielectric layer.

15 Claims, 11 Drawing Sheets

US 9,935,251 B1

LED CHIP PACKAGING WITH HIGH PERFORMANCE THERMAL DISSIPATION

REFERENCE TO RELATED APPLICATION

This application claims the benefit of U.S. Provisional Application Ser. No. 61/790,460, filed on Mar. 15, 2013, and entitled LED Chip Packaging With High Performance Thermal Dissipation, which is incorporated herein by reference in its entirety for all purposes.

TECHNICAL FIELD

The present invention relates generally to a LED packages having enhanced thermal performance.

BACKGROUND

Light emitting diodes (LED's) are electrically powered semiconductor light sources. An LED chip can be made from silicon or other semiconductor material doped with impurities to create a p-n junction. Electrical current passing across the junction allows electrons to recombine with electron holes within the doped material, thereby releasing photons.

An LED chip can be mounted in a package to support and protect the LED chip, provide an electrical connection, and help dissipate heat generated by the LED chip. LED package designs can have several constraining factors. One factor is cost, which must be kept low because of the high volume of LED's manufactured. Costs are influenced by manufacturability and materials, among other things. Another factor is heat management. Specifically, the packaging of an LED chip must dissipate enough thermal energy, generated by the LED chip during light production and transmission, to avoid overheating and damaging the LED chip. Higher power LED chips are increasing in use, which further underscores the need for high thermal performance LED chip packaging. Various embodiments of the present disclosure concern LED chip packages for efficient manufacturing and/or high performance thermal dissipation.

SUMMARY

A LED package in accordance with embodiments of the invention includes a metal base, a flexible circuit, a dielectric layer, and an LED chip. The base has a top side having a planar surface and a cavity formed within the base on the top side. The cavity is sunken below the planar surface, and comprises a bottom surface. The flexible circuit comprises a bottom insulation layer, a first conductive trace layer on the bottom insulation layer, and a second conductive trace layer on the bottom insulation layer. The bottom insulation layer has a void section between the first and second trace layers, and is adhered to the planar surface. The bottom insulation layer is formed from a first type of material. The dielectric layer is within the cavity, and formed from a second type of material. The dielectric layer is within the bottom insulation void section. The second type of material has higher thermal conductivity than the first type of material. The LED chip has a bottom side facing the base bottom surface and a first electrical contact on the bottom side. The first electrical contact opposes, and is electrically connected to, the first section. When the LED chip is powered by current flowing between the first conductive trace layer and the first electrical contact, heat generated by the LED chip is conducted through the dielectric layer.

DETAILED DESCRIPTION

LED Chip Mounted within a Cavity and Below an Electrical Circuit

Figure 1:
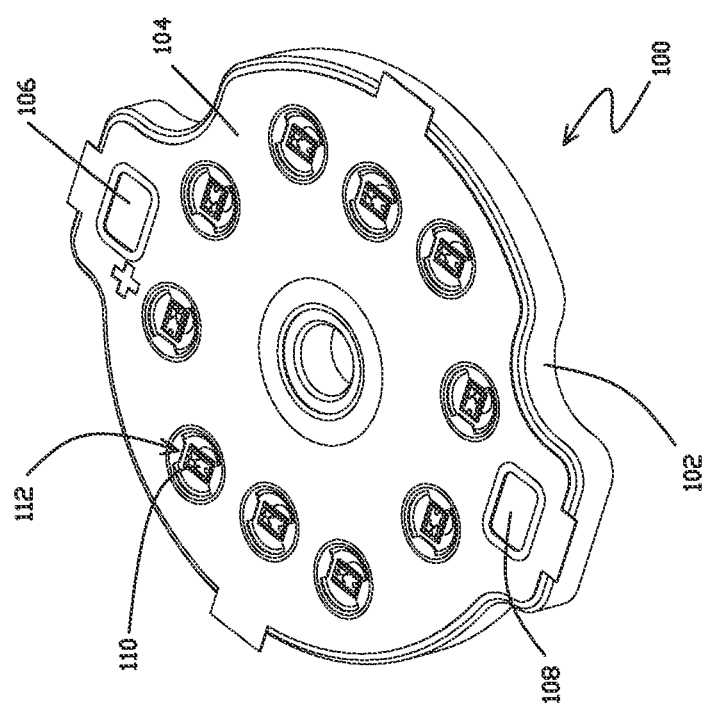
FIG. 1 is a perspective view of a plurality of lateral LED chips mounted on a base.

FIG. 1 is a perspective view of a LED package system 100. As shown, ten LED chips are mounted within the LED package system 100, including LED chip 110. The LED package system 100 includes a base 102. The base 102 can be formed from metal, such as aluminum, copper, or other metal. The base 102 can be about one millimeter thick, for example. The base can be formed by stamping, etching, or any other technique for forming shapes as shown or described herein. As shown, one or more cavities can be formed within the base 102. Each cavity may be about 250 microns deep, for example. Each of the LED chips can be partially or wholly within a respective one of the cavities. For example, LED chip 110 is located within cavity 112.

The LED package system 100 includes multiple layers disposed on a top surface of the base 102. The layers can comprise layers of a flexible circuit, as will be further discussed herein. Conductive traces within the flexible circuit route electrical power to each of the LED chips. The LED package system 100 includes anode electrical contact 106 and cathode electrical contact 108 for making electrical connections with a circuit providing power. The flexible circuit can include a top reflective layer 104. The reflective layer can be a thin layer of sputtered or plated material such as aluminum, silver, solder, or other metal. Alternatively, a reflective layer can be provided by mechanically or electrically polishing one or more metal surfaces of the LED package system 100. A reflective layer can be provided on surfaces other than the flexible circuit, such as within each cavity. The conductive traces within the flexible circuit can make appropriate electrical connections with the LED chip 110, as further discussed herein.

Figure 2A:
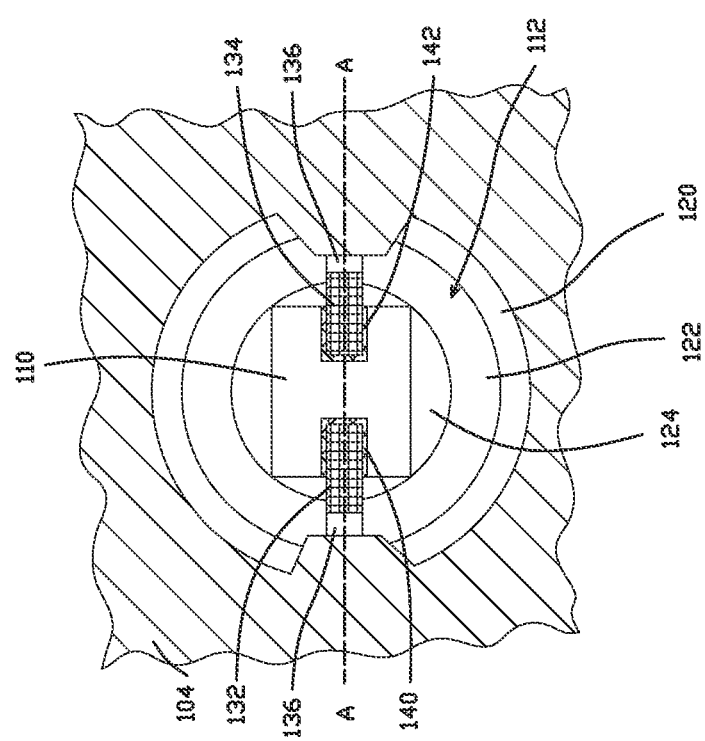
FIG. 2A is an overhead view of the packaging encompassing one lateral LED chip of FIG. 1.
Figure 2B:
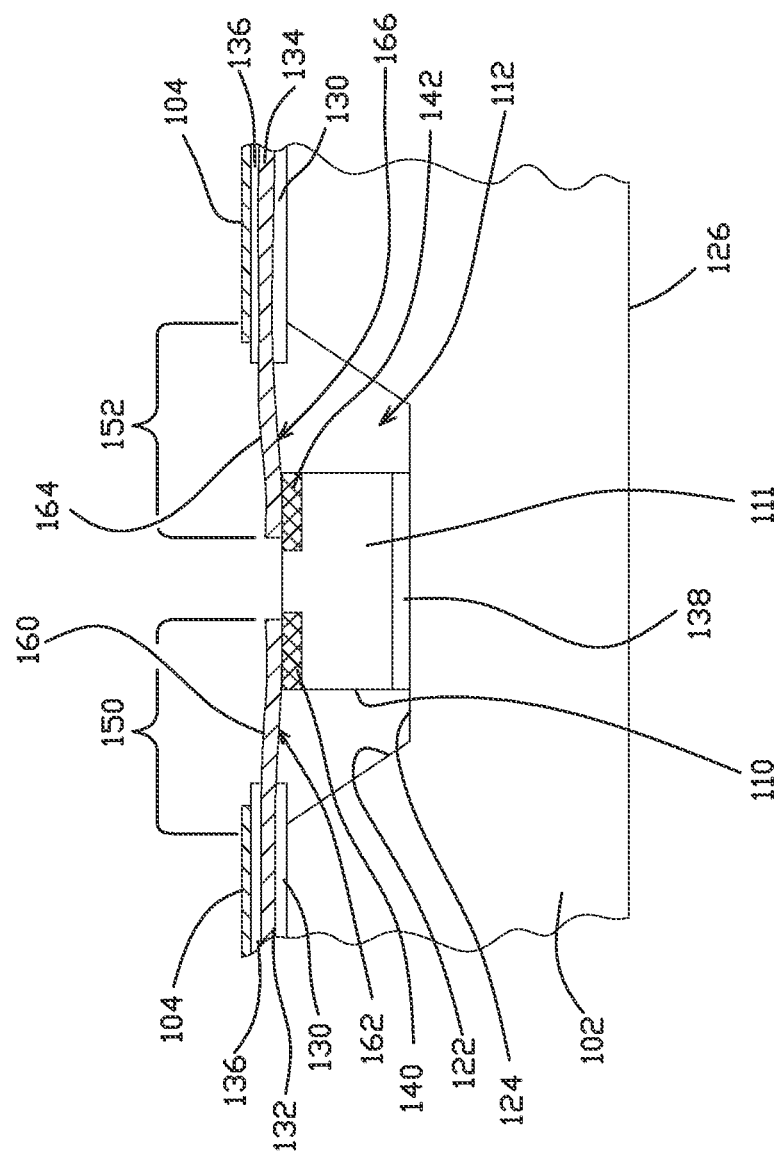
FIG. 2B is a cross-sectional view, taken along line A-A in FIG. 2A, of the packaging encompassing one lateral LED chip.

FIG. 2A illustrates a top view, and FIG. 2B illustrates a side view cross section taken along line A-A, of the LED chip 110 within the cavity 112. As shown in FIGS. 2A-B, the cavity 112 is sunken below a top planar surface 120 of the base 102. The top planar surface 120 can extend to the edge of, and surround, each of the cavities of the base 102. The cavity 112 further includes a bottom surface 124 and a ramped surface 122 extending between the top planar surface 120 and the bottom surface 124. The bottom surface 124 and/or the ramped surface 122 can be reflective or have a reflective coating applied thereon (e.g., by sputtering) to increase the reflectivity within the cavity 112. In this way, the cavity 112 can redirect light generated by the LED chip 110 and focus the light in an intended direction away from the cavity 112. The cavity 112 of FIGS. 2A-B has a circular shape, but various other embodiments can have other shapes, such as a square or rectangular shape. The cavity 112 has a trapezoidal cross section, however some other embodiments can have different cavity cross sectional shapes, such as square and rectangular shapes (e.g., such that the ramped surface 122 would instead be a vertical surface joining the top planar surface 120 and the bottom surface 124).

The layers of the flexible circuit are shown in FIG. 2B. The flexible circuit can extend over the top planar surface 120 of the base 102. The flexible circuit can include a bottom insulation layer 130 and a top insulation layer 136. The bottom insulation layer 130 and the top insulation layer 136 can be formed from the same type of material. For example, the bottom insulation layer 130 and the top insulation layer 136 can each be formed from polyimide. Alternatively, the bottom insulation layer 130 and the top insulation layer 136 can each be formed from different materials. The bottom insulation layer 130 can be directly adhered to the top planar surface 120 of the base 102. An adhesive (not illustrated in FIGS. 2A-B) can be used to bond the bottom insulation layer 130 to the top planar surface 120 of the base 102. As shown, the reflective layer 104 can be disposed on the top insulation layer 136. In some embodiments where the reflective layer 104 has dielectric properties, the top insulation layer 136 can be absent and the reflective layer 104 can be disposed on the top surface of a conductive trace layer 132 of the flexible circuit. Some embodiments may not include a top insulation layer 136 or other dielectric layer. Although not illustrated in FIG. 2B, the flexible circuit can wrap around the base 102 such that the bottom insulation layer 130 is directly adhered to the bottom surface 126 of the base 102. Additionally, the top insulation layer 136 can be selectively removed to create solder contact bond pads to make electrical connections with other electrical components such as a power supply. Such a wrapping configuration can provide contacts to surface mount the LED package system 100 to another circuit board using a surface mount soldering technique.

One or more conductive trace layers can be disposed between the bottom insulation layer 130 and the top insulation layer 136. As shown in FIG. 2B, a first conductive trace layer 132 is disposed between the bottom insulation layer 130 and the top insulation layer 136. Likewise, a second conductive trace layer 134 is disposed between the bottom insulation layer 130 and the top insulation layer 136. The first conductive trace layer 132 and the second conductive trace layer 134 can be coplanar, non-overlapping, and electrically isolated with respect to each other. The flexible circuit can be prefabricated such that the bottom insulation layer 130, the top insulation layer 136, the first conductive trace layer 132, and the second conductive trace layer 134 are combined before the flexible circuit is connected to the base 102. The flexible circuit can be fabricated by electrochemical etching, plating, or vapor deposition processes.

The first conductive trace layer 132 and the second conductive trace layer 134 are respectively coupled, mechanically and electrically, with a first electrical contact 140 and a second electrical contact 142 of the LED chip 110. The first electrical contact 140 and the second electrical contact 142 are respective electrical contacts for powering the LED chip 110. As shown in FIGS. 2A-B, the first electrical contact 140 and the second electrical contact 142 are located on a top side of the LED chip 110.

As shown in FIGS. 2A-B, the first lead portion 150 of the flexible circuit can span from the top planar surface 120 of the base 102 to connect with the first electrical contact 140 and thereby extending over the cavity 112. Likewise, the second lead portion 152 of the flexible circuit can span from the top planar surface 120 of the base 102 to connect with the second electrical contact 142. The flexible circuit can include a number of voids in the insulation layers, which can serve multiple purposes. The first lead portion 150 includes a first void in the top insulation layer 136 to expose a first section 160 of the first conductive trace layer 132. The first lead portion 150 includes a second void in the bottom insulation layer 130 to expose a second section 162 of the first conductive trace layer 132. As shown in FIG. 2B, the first section 160 and the second section 162 overlap on opposite sides of the first conductive trace layer 132. Likewise, the second lead portion 152 includes a third void in the top insulation layer 136 to expose a third section 164 of the second conductive trace layer 134 and a fourth void in the bottom insulation layer 130 to expose a fourth section 166 of the second conductive trace layer 134, the third section 164 and the fourth section 166 overlapping on opposite sides of the second conductive trace layer 134. During assembly, heat or ultrasonic energy can be delivered from the first section 160 through the first conductive trace layer 132 to the second section 162. The second section 162 may be in direct contact with the first electrical contact 140 to mechanically and electrically couple upon delivery of the energy. Solder, electrically conductive adhesive or other element may be disposed between the second section 162 and the first electrical contact 140 to facilitate the coupling. The fourth section 166 of the second conductive trace layer 134 can be coupled with the second electrical contact 142 in a similar way.

Various features of the LED package system 100 can allow for quality control and rework advantages in manufacturing. It is possible that any particular LED chip (e.g., LED chip 110), part of the flexible circuit (e.g., lead portions 150 or 152), or other components may be defective. For example, current may not flow through the LED chip 110 during an operational test phase. The malfunction of a single component in a conventional LED package system may lead to scrapping of the entire conventional LED package system, which can waste otherwise functional components on the same assembly. Embodiments of the present disclosure can allow for in-process testing and rework to avoid scrapping of functional subassemblies. For example, a spare set of leads (not shown), similar to lead portions 150 and 152, can be provided. The spare leads can be located 90 degrees relative to the lead portions 150 and 152 and can be attached to the same flexible circuit. The different positioning of the spare leads, relative to the original lead portions 150 and 152, can allow the LED chip 110 to be rotated 90 degrees to connect with the spare leads if, upon connection with the original lead portions 150 and 152, the LED package system 100 fails a quality test (e.g., fails of electrical connection or insufficient light output). The other embodiments of the present disclosure can contain such alternative leads and rework options.

The LED chip 110 and the flexible circuit can be aligned such that the top surface of the LED chip 110 is below the top planar surface 120 of the base 102. In some cases, first lead portion 150 and the second lead portion 152 can extend over the cavity 112 to the LED chip 110 such that the first lead portion 150 extends parallel with the top planar surface 120 of the base and is coplanar with the rest of the flexible circuit.

The LED chip 110 may have a base layer 111. The base layer 111 can be internal to the LED chip 110. The base layer 111 can be a dielectric that is thermally conductive and electrically insulative, such as aluminum oxide or gallium nitride. A thermally conductive and electrically conductive die attachment layer 138, such as solder or adhesive (e.g., silver filled electrically conductive epoxy or having metal fillers), can couple the bottom surface of the LED chip 110 to the bottom surface 124 of the cavity 112. Die attachment layer 138 can be deposited on the bottom surface 124 during assembly and then the LED chip 110 can be placed on the die attachment layer 138 to anchor the LED chip 110. Besides anchoring the LED chip 110, the die attachment layer 138 can control the vertical spacing of the LED chip 110 for alignment with the first lead portion 150 and the second lead portion 152. The die attachment layer 138 also serves as a thermal conduit to channel heat away from the LED chip 110 to the base 102. The base 102 serves as a heat sink, spreading out thermal energy for dissipation outside of the LED package system 100.

As shown, the LED chip 110 can include a base layer 111 that is not a dielectric, in which case the die attachment layer 138 would need to be electrically insulative as well as thermally conductive. In this case, to enhance the channeling of heat away from the LED chip 110, suitable materials for the die attachment layer 138 could include ceramic coatings, adhesives, or films or other dielectric materials having a high thermal conductivity, such as 10 watt per degree Kelvin per meter or more.

Preferably, the thickness of the die attachment layer 138 is minimized in order to minimize its thermal resistance and quantity of material used. The footprint of the die attachment layer 138, which may be the same as the footprint of the LED chip 110, is also minimized to minimize the quantity of material used.

Although not illustrated, it is noted that the cavity 112 can be filled with an encapsulant material such as a clear optical grade silicone or epoxy. In some embodiments, the encapsulant material can include additives such as a phosphor material that broadens the light wavelengths emitted from the LED package system 100 or other materials that provide light conditioning benefits as needed. The encapsulant may fill the cavity 112 and encapsulate the LED chip 110. Additionally or alternatively, a lens or dome can be provided above the LED chip 110. For example, the lens or dome can be aligned with the lip of the cavity 112 and may include one or both of light diffusing and light wavelength broadening (phosphor) features.

LED Chip Mounted within a Cavity and Above an Electrical Circuit

While FIGS. 2A-B shown some LED chip packaging features, other configurations are also contemplated. For example, the base 102 of FIGS. 1-2B could include LED chip mountings having different configurations. As further discussed below, FIGS. 3A-B show various options for LED chip packages which can be used with, or as an alternative to, the options described above.

Figure 3A:
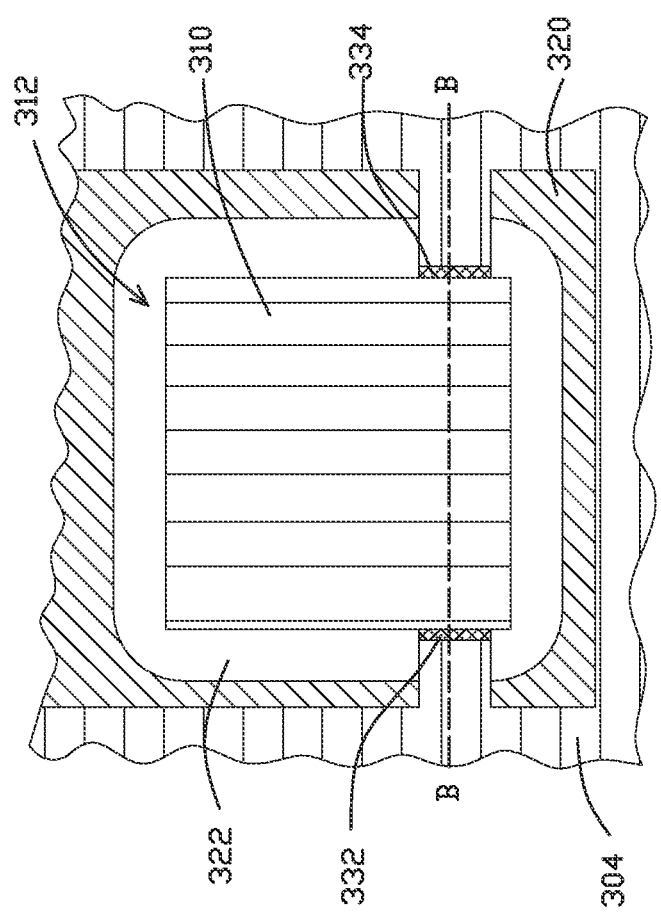
FIG. 3A is an overhead view of LED chip packaging for a flip chip LED chip.
Figure 3B:
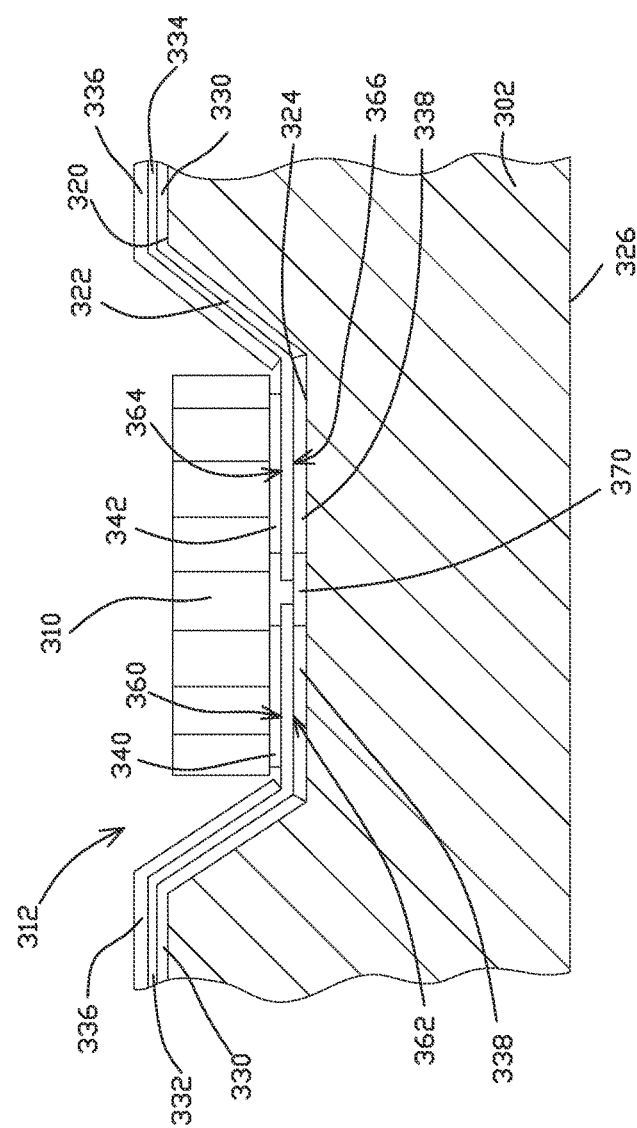
FIG. 3B is a cross-sectional view, taken along line B-B in FIG. 3A, of the packaging of the LED chip.

FIG. 3A illustrates a top view, and FIG. 3B illustrates a side view cross section taken along line B-B, of an LED chip 310 within cavity 312. As shown in FIGS. 3A-B, the cavity 312 can be sunken below a top planar surface 320 of the base 302. The top planar surface 320 can extend to the edge of, and surround, each of the cavities of the base 302. The cavity 312 can further include a bottom surface 324 and a ramped surface 322 extending between the top planar surface 320 and the bottom surface 324. The cavity 312 of FIGS. 3A-B has a square shape and a trapezoidal cross section.

FIG. 3B shows a flexible circuit comprising multiple layers. The flexible circuit can extend over the top planar surface 320 of the base 302. The flexible circuit can include a bottom dielectric layer 330 and a top insulation layer 336. The bottom dielectric layer 330 and the top insulation layer 336 can be formed from the same type of material, such as polyimide. A reflective layer, as described herein, can be disposed on the top insulation layer 336. A first conductive trace layer 332 is disposed between the bottom dielectric layer 330 and the top insulation layer 336. Likewise, a second conductive trace layer 334 is disposed between the bottom dielectric layer 330 and the top insulation layer 336. The first conductive trace layer 332 and the second conductive trace layer 334 can be coplanar and non-overlapping, and can function as separate electrical conductors of the flexible circuit.

The bottom dielectric layer 330 is directly adhered to the top of the base 302. Specifically, the flexible circuit is adhered to the top planar surface 320 and the ramped surface 322. An adhesive (not illustrated) can be disposed between the bottom dielectric layer 330 and each of the top planar surface 320 and the ramped surface 322 to facilitate the attachment. Although not illustrated in FIG. 3B, the flexible circuit can wrap around the base 302 such that the bottom dielectric layer 330 is against the bottom surface 326 of the base 302. The flexible circuit follows the contours of the base 302, including within the cavity 312. A first electrical contact 340 and a second electrical contact 342 of the LED chip 310 are located on a bottom side of the LED chip 310. The flexible circuit extends underneath the LED chip 310 and parallel to the bottom surface 324 to electrically connect with the LED chip 310 and provide other functions, as discussed below.

The first conductive trace layer 332 and the second conductive trace layer 334 are respectively coupled (mechanically and electrically) with a first electrical contact 340 and a second electrical contact 342 of the LED chip 310. The flexible circuit includes a first void in the top insulation layer 336 to expose a first section 360 of the first conductive trace layer 332. The first section 360 is underneath the LED chip 310 and faces upward to couple with the downward facing first electrical contact 340. A second void in the bottom dielectric layer 330 exposes a second section 362 of the first conductive trace layer 332. The second section 362 faces downward to couple with the dielectric layer 338. The first section 360 is on the opposite side of the first conductive trace layer 332 with respect to the second section 362 while the first section 360 and the second section 362 are aligned to overlap each other. The flexible circuit further includes a third void in the top insulation layer 336 to expose a third section 364 of the second conductive trace layer 334 and a fourth void in the bottom dielectric layer 330 to expose a fourth section 366 of the second conductive trace layer 334. The third section 364 is on the opposite side of the second conductive trace layer 334 with respect to the fourth section 366 while the third section 364 and the fourth section 366 are aligned to overlap each other. The dielectric layer 338 is disposed directly on the bottom surface 324 of the cavity 312. The dielectric layer 338 directly contacts the second section 362 and the fourth section 366.

The voids in the top insulation layer 336 and the bottom dielectric layer 330 of the flexible circuit, and the provision of the dielectric layer 338, significantly enhances the thermal performance of the LED chip package. The first void in the top insulation layer 336 and the second void in the bottom dielectric layer 330 allows heat generated by the LED chip 310 to flow from the LED chip 310 to the first electrical contact 340, the first conductive trace layer 332, the dielectric layer 338, to the base 302. Each of the layers in this heat pathway are metal (except the dielectric layer) and are accordingly good thermal conductors. The dielectric layer 338 essentially replaces the material of the bottom dielectric layer 330 (e.g., within the footprint of the LED chip 310) with a material having much higher thermal conductivity. For example, the dielectric layer 338 can comprise a ceramic or diamond (e.g., sapphire) filled adhesive substrate with high thermal conductivity. The dielectric layer 338 is expensive compared to the dielectric material of the insulation layers of the flexible circuit. However, the dielectric layer 338 may be strategically applied only below the footprint of the first electrical contact 340 and the second electrical contact 342 to facilitate the transfer of heat to the base 302 while the less expensive dielectric material of the top insulation layer 336 and the bottom dielectric layer 330 is used in other areas where electrical insulation is needed but high thermal conductivity is not as critical. For example, the dielectric layer 338 may be disposed only over an area within a footprint of the electrical contacts of the LED chip 310, only over an area within the footprint of the LED chip 310, only over an area within the footprints of the second section 362 and the fourth section 366, or only along the bottom surface 324 of the cavity 312, among other options. The dielectric layer 338 can have a thermal conductivity property fifty times greater than typical insulation layers of flexible circuits. The dielectric layer 338 can be about 10 microns thick, although other thicknesses are possible. The thickness of the dielectric layer 338 can be optimized based on the properties of available materials, in view of a direct tradeoff between electrical insulation (dielectric breakdown strength) and thermal conductivity performance levels. Being that much of the heat generated by the LED chip flows through the dielectric layer 338, the thermal performance of the LED chip package is related to the thickness of the dielectric layer 338. Controlling the thickness of the dielectric layer 338 is further discussed herein.

A standoff element 370 is provided coplanar with the dielectric layer 338 and between the bottom surface 324 and the flexible circuit. The standoff element 370 can be a dot or strip of a dielectric material having a thickness. In embodiments where the standoff element 370 is a strip, the strip can extend from one edge of the bottom surface 324 to an opposing edge of the bottom surface 324. The standoff element 370 can be adhered to the bottom surface 324. The standoff element 370 can be formed from a dielectric such as polyimide. The standoff element 370 can be deposited on the bottom surface 324 during assembly, before the dielectric layer 330 and/or the flexible circuit are applied to the base 302. The dielectric layer 338 can then be deposited, as a substrate, on the bottom surface 324 within and/or around the standoff element 370. The flexible circuit can then be pressed against the top of the base 302. The flexible circuit can be aligned with the cavity 312 such that the second and fourth voids in the bottom dielectric layer 330 are filled with the dielectric layer 338 when the flexible circuit is pressed against the base 302. The standoff element 370 engages the flexible circuit (e.g., engages the first conductive trace layer 332 and the second conductive trace layer 334) while excess dielectric substrate is squeezed out. In this way, the thickness of the dielectric layer 338 can be controlled by the standoff element 370, such that the thickness of the dielectric layer 338 is the same as the thickness of the standoff element 370.

While the standoff element 370 can be provided directly on the base 302 in some embodiments before other layers are applied to the base 302, the standoff element 370 can alternatively be formed or deposited in other ways. In various embodiments, the standoff element 370 can be part of the flexible circuit and can be applied to the base 302 as the flexible circuit is placed along the base 302. For example, the standoff element 370 can be part of the original bottom dielectric layer 330 that is left in place when the second void and the fourth void in the bottom dielectric layer 330 are created by stripping away the bottom dielectric layer 330 to expose the second section 362 of the first conductive trace layer 332 and the fourth section 366 of the second conductive trace layer 334. In this way, the thickness of the standoff element 370 will match the depth of the voids in the bottom dielectric layer 330 to be filled in with the dielectric layer 338. In various other embodiments, the standoff element 370 can be formed by selectively removing the dielectric layer 330, in place on the base 302, to form a space for the standoff element 370. The space can then be filled in with the standoff element 370. In another embodiment, the standoff element 370 can be incorporated into the dielectric layer 330 before the dielectric layer 330 is applied to the base 302 as a layer.

Although not illustrated, it is noted that the cavity 312 can be filled with a encapsulant that may include a phosphor material that broadens the light wavelengths emitted from the LED chip 310. The phosphor may fill the cavity 312 and encapsulate the LED chip 310. Additionally or alternatively, a lens or dome that diffuses the light and or broadens the emitted wavelengths can be provided above the LED chip 310, such as aligned with the lip of the cavity 312.

LED Chip Mounted Above Two Dielectric Layers

Figure 4:
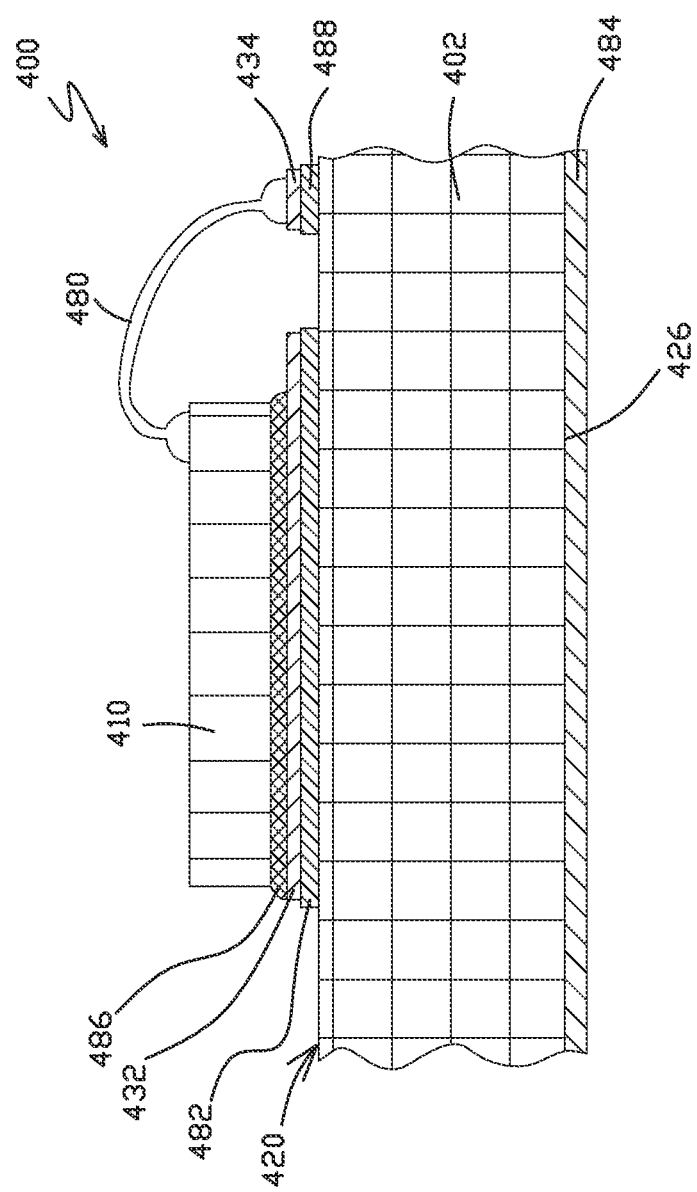
FIG. 4 is cross-sectional view of a vertical LED chip mounted on a substrate surface having dual dielectric layers

FIG. 4 illustrates a side view cross section of a vertical LED chip 410 mounted on a base 402. The base 402 can be a stamped metal piece. While the LED chip 410 can be placed within a cavity of the base 402, as with previously described embodiments, the particular embodiment of FIG. 4 does not include a cavity. The metal of the base 402 can comprise copper or aluminum, for example. The base 402 can be about 1 millimeter thick, however other thicknesses are contemplated. The base 402 can include a top surface 420.

The LED chip 410 is powered by electrical energy provided by anode and cathode electrical contacts (not illustrated) on the top and the bottom of the LED chip 410. A first conductive trace layer 432 is electrically and mechanically connected to an electrical contact on the bottom side of the LED chip 410 by solder 486. A second conductive trace layer 434 is electrically connected to an electrical contact on the top side of the LED chip 410 by lead 480. Lead 480 has solder or gold ends to mechanically and electrically connect with the electrical contact on the top of the LED chip 410 and the second conductive trace layer 434.

Each of the first conductive trace layer 432, the second conductive trace layer 434, and the LED chip 410 must be electrically isolated from the electrically conductive base 402. A first dielectric layer 482 is disposed between the top surface 420 and the first conductive trace layer 432. The first dielectric layer 482 can be directly adhered to each of the top surface 420 and the first conductive trace layer 432. An additional dielectric layer 488 is disposed between the top surface 420 and the second conductive trace layer 434. The thickness of the first dielectric layer 482 is kept to a minimum to facilitate the transfer of heat generated by the LED chip 410 to the base 402, as further discussed below. Both the thickness and material-type of dielectric layer 482 can be different than the thickness and material-type of dielectric layer 488.

UL electrical standards require the dielectric strength of a system withstand at least 1000V plus twice the maximum drive voltage of the system before breakdown occurs. Conventional LED systems may provide a single dielectric layer between a conductor and other conductive components to satisfy the UL requirements and prevent breakdown. The single layer is conventionally made thick enough to satisfy the UL requirements. For example, a conventional single dielectric layer insulating an LED chip from a mounting structure may be between about 75 microns and 25 microns, depending on the type of material. However, dielectric layer thickness is inversely proportional with the thermal conductivity of the dielectric layer. The embodiment of FIG. 4 manages heat generated by the LED chip 410 by minimizing the thicknesses of the first dielectric layer 482. Specifically, the first dielectric layer 482 is thin such that it does not provide enough dielectric breakdown strength to satisfy the UL standards for preventing breakdown between the LED chip 410 and the base 402. Rather, the first dielectric layer 482 is only thick enough to prevent dielectric breakdown of voltages only slightly greater than the maximum operating voltage of the LED chip 410 (e.g., 20% greater than the maximum operating voltage of the LED chip 410). For example, the first dielectric layer 482 may be only 5-15 microns thick. The LED package system 400 can nevertheless satisfy the UL standards with the second dielectric layer 484.

The second dielectric layer 484 is provided on a bottom side 426 of the base 402. The second dielectric layer 484 can additionally or alternatively be provided on other surfaces of the base 402. For example, while the first dielectric layer 482 can be disposed along a top side (e.g., as a first side) and the second dielectric layer 484 can be disposed along a bottom side 426 (e.g., as a second side), the second dielectric layer 484 can be disposed along any or all of the remaining lateral sides (e.g., as third, fourth, fifth, and sixth sides in a six sided base 402). The second dielectric layer 484 can be provided between the base 402 and other conductive elements not shown in FIG. 4, such as a supporting structure and/or heat sink. For example, the second dielectric layer 484 can be disposed directly between, and optionally be adhered to each of, the base 402 and a larger metal supporting structure or heat sink. The second dielectric layer 484 may alone provide enough dielectric breakdown strength to satisfy the UL requirements for the LED package system 400, or the second dielectric layer 484 may only satisfy the UL requirements for the LED package system 400 when combined with the dielectric breakdown strength of the first dielectric layer 482.

It is noted that the footprint of the first dielectric layer 482 is less than the footprint of the second dielectric layer 484. A larger surface area (e.g., the interface between the base 402 and the second dielectric layer 484) can conduct more heat than a smaller surface area (e.g., the interface between the base 402 and the first dielectric layer 482). As such, approximately equal amounts of thermal energy may flow through the first dielectric layer 482 and the second dielectric layer 484 (at steady state) because the first dielectric layer 482 is thinner than the second dielectric layer 484, but the thermal energy has space to spread out within the base 402 and thus can flow through the thicker second dielectric layer 484 over a greater surface area. In this way, the base 402 spreads out the thermal energy flowing between two dielectric layers that, when combined, satisfy the UL standards for dielectric strength.

Various options for the use of dual dielectric layers are contemplated. For instance, a cavity can be formed in base 402, and the LED chip 410 could be mounted within the cavity, as discussed herein in other embodiments. The surfaces defining the cavity and/or other surfaces, can be reflective. In this case flex circuit traces having features similar to 104, 130, 134, 136, 152 and 164 of FIG. 2 would be used to replace features 434, 480, and 488 of FIG. 4. Likewise, features 432, 482, and 486 of FIG. 4 would be replaced with features 330, 334, 336, 370, and 338 of FIG. 3. This design option would then no longer need the second dielectric layer 484 and thus no longer be considered a dual dielectric configuration. Another configuration option would be to remove the first dielectric layer 482 while retaining dielectric layers 488 and 484 resulting in a design configuration, defined as having one dielectric and partially two dielectrics, that is fully described in the section titled "LED Chip Having One and Partially Two Dielectric Layers."

LED Chip Mounted Above a Fluid Dielectric Layer

The previously described LED package embodiments generally describe dielectric layers that are in solid form during the finished or operational state of the LED. A liquid dielectric material may supplement, or be substituted for, a dielectric layer or other components of the other embodiments referenced herein, such as dielectric layer 338 or die attachment layer 138. A liquid dielectric can transfer heat by conduction as well as by convection (flow), evaporation, and condensation events, and has other advantages. Therefore, the use of a liquid dielectric material along the thermal path between an LED chip and a base or other heat sink has the potential to dramatically improve heat dissipation and lower the operating junction temperature of the LED chip.

Figure 5A:
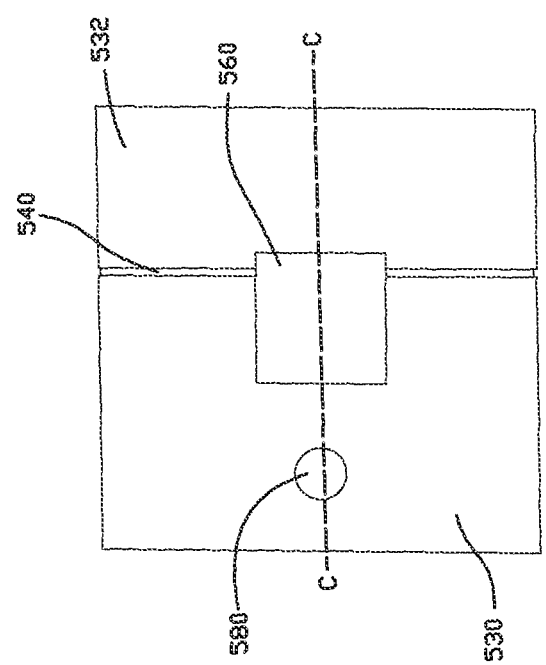
FIGS. 5A and 5B illustrate top and cross-sectional views (C-C) of an LED package that contains a fluid dielectric layer.
Figure 5B:
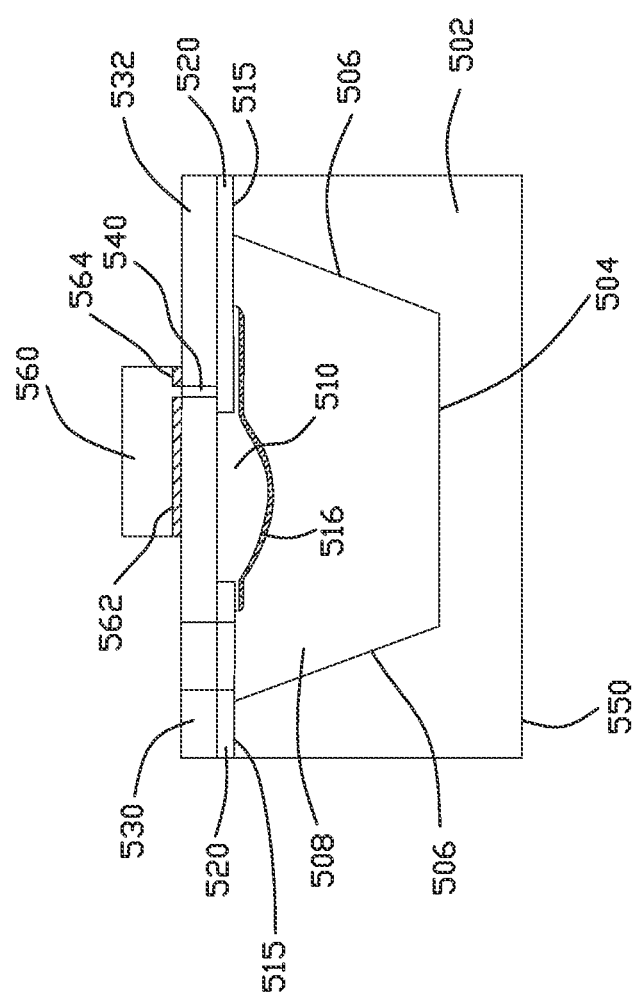

FIG. 5A shows an overhead view of an LED chip 560. FIG. 5B shows a cross sectional view along C-C of FIG. 5A. FIG. 5B shows that the LED chip 560 has a first electrical contact 562 and a second electrical contact 564, electrically isolated from the first electrical contact 562, on the bottom side of the LED chip 560. The first electrical contact 562 can serve as one of an anode or cathode terminal for the LED chip 560 while the second electrical contact 564 can serve as the other of the anode or cathode terminal for the LED chip 560. As shown, the first electrical contact 562 is larger than the second electrical contact 564. The first electrical contact 562 can have a larger footprint (i.e. downward facing surface of the bottom of the LED chip 560) than the second electrical contact 564. The first electrical contact 562 can have a greater mass of conductive metal than the second electrical contact 564. The first electrical contact 562 and the second electrical contact 564 are electrically connected (e.g., by solder) to the first conductive layer 530 and the second conductive layer 532, respectively. The first conductive layer 530 and the second conductive layer 532 can each be metal traces, such as copper traces. The first electrical contact 562 and second electrical contact 564 can be electrically isolated from each other via an etched void 540. The first conductive layer 530 and the second conductive layer 532 are respectively connected to the negative and positive junctions of a current source (not shown). The current source can be part of an LED package system as discussed herein.

A dielectric layer 520 is provided between a top surface 515 of a base 502 and the bottom surfaces of the first conductive layer 530 and the second conductive layer 532. The dielectric layer 520 is formed from solid material, such as polyimide. The dielectric layer 520 can be attached to the top surface 515 of the base 502. The base 502 can be made from metal such as aluminum or other substrate. The base 502 includes a cavity 508 that is created (e.g., etched or stamped) prior to attaching the dielectric layer 520 to the top surface 515. The cavity 508 can be defined by an inner bottom surface 504 and side surfaces 506. A conductive feature 510 can extend over and/or within the cavity 508. The conductive feature 510 can be a layer of metal. As shown, the conductive feature 510 can include a downward projection 516. The downward projection 516 can comprise any of a bulge, convex, mushroom, non-linear, or other shape facing into the cavity 508.

The dielectric layer 520, along with the base 502 and/or conductive feature 510, can seal a fluid dielectric (not shown) within the cavity 508 of the base 502. The fluid dielectric is in a fluid and/or vapor state during operation of the LED chip 560. The cavity 508 can be filled (partially or fully) with the fluid dielectric. One or both of the dielectric layer 520 and fluid dielectric within the cavity 508 can electrically isolate the first conductive layer 530, the second conductive layer 532, and the conductive feature 510 from the base 502. The fluid dielectric can be a hydrofluroether liquid, such as 3M™ Novec™ brand engineering fluids.

The dielectric layer 520 can generally span along a planar top surface 515 of the base 502. However, as show in FIG. 5B, the dielectric layer 520 can have a discontinuity, such as a void, over the cavity 508. The discontinuity is shown as a void in FIG. 5B, however other options are contemplated, such as a relatively thin portion of the dielectric layer 520 as compared to other (thicker) sections of the dielectric layer 520. The discontinuity can be partially or fully underneath the footprint of the LED chip 560. The discontinuity can increase the thermal performance of the LED package system by having less insulative dielectric layer 520 underneath the LED chip 560 where much of the heat generated by the LED chip 560 dissipates. Moreover, a conductive feature 510 is disposed within the void of the discontinuity. The conductive feature 510 can be made of metal or other material having high thermal conductance. As such, the conductive feature 510 can conduct heat past the dielectric layer 520 and to the fluid dielectric in the cavity 508. It is noted that the conductive feature 510 is in physical and electrical contact with the first conductive layer 530, and is therefore in electrical contact with the first electrical contact 562 of the LED chip 560, but the conductive feature 510 is not in physical or electrical contact with the second conductive layer 532, and is therefore not in electrical contact with the second electrical contact 564 of the LED chip 560. While the conductive feature 510 may be electrically energized while the LED chip 560 is powered, current does not escape from the conductive feature 510 to the base 502 because the conductive feature 510 is insulated by the dielectric layer 520 and the liquid dielectric.

A hole 580 can be provided through one of the first conductive layer 530 or the second conductive layer 532 to allow filling the cavity 508 with the fluid dielectric. The hole can then be plugged or sealed prior to operating the LED package. The fluid dielectric could also be spread into the cavity 508 prior to attaching the dielectric layer 520 and/or the first conductive layer 530 and the second conductive layer 532, thus eliminating the need for the hole 580.

The fluid dielectric can be selected to have a boiling point below the maximum desired LED chip junction temperature and above the ambient temperature outside the LED package system. During the operational state of the LED, the conductive feature 510 can heat the fluid dielectric to its boiling point and then vaporize a portion of the fluid dielectric. The heat transfer rate from the LED chip 560 during this vaporization phase can be significantly greater than conductive heat transfer through the fluid dielectric to the base 502, thus providing a heat buffer.

The conductive feature 510 can directly contact the conductive layer 530 through a cavity created in the dielectric layer 520 to provide improved thermal conductivity between the LED chip 560 and the fluid dielectric. The conductive feature 510 can be thickest in its center area directly beneath LED chip 560 and taper or ramp to thinner sections that are closer to the side surfaces 506 of the base 502. During an operational state when the LED package is orientated with the LED chip 560 upright, the downward projection 516 can mitigate accumulation of dielectric vapor directly below the LED chip 560 and can direct the vapor to the cooler side surfaces 506 of the base 502 where heat can be transferred to the base 502 allowing the vapor to condense back to a fluid state. An efficient mode of heat transfer could also be obtained when the LED package is operated in a down position, opposite the upright position. In this case, the dielectric vapor, being less dense than the fluid dielectric, would flow up to the bottom surface 504 and condense back to the fluid state.

The design, as described above, can be used with a fluid dielectric operating in both liquid and gaseous phases. Another configuration concerns use a fluid dielectric having a boiling point above the operating junction temperature of the LED chip 560 to assure that the fluid dielectric remains a liquid in operation to conduct heat via conduction and convection. When the LED package is orientated downward, convective heat transfer occurs as the heated (and therefore less dense) fluid dielectric floats up to the bottom surface 504 of the base 502. To enhance convective heat transfer in an LED up positional state, the bulging, convex, mushroom, non-linear, or other shape of downward projection 516 can direct the heated (and therefore more buoyant) fluid to the cooler side surfaces 506 of the base 502. The surface tension of the fluid dielectric and inside dimensions within base 502 can also be optimized to promote Marangoni convection. During Marangoni convection, a surface tension gradient between the hotter (lower surface tension) and cooler (higher surface tension) dielectric layers creates multicellular fluid layers that spin or rotate between the conductive feature 510 and cooler side surfaces 506.

Various modifications can be made to the embodiment of FIGS. 5A-B. For example, while the fluid dielectric is sealed within the cavity 508 by the base 502, the dielectric layer 520, and the conductive feature 510, the fluid dielectric may alternatively be contained by fewer and/or different structures. For example, a single dielectric or conductive layer may extend over top side of the base 502 and be attached to the top surface 515 to contain the fluid dielectric within the cavity 508. While the downward projection 516 of FIG. 5B is shown as being formed by the conductive feature 510, the downward projection could alternatively be formed by a dielectric layer, such as dielectric layer 520. In the case of a single conductive layer, the conductive layer is treated or anodized to form a metal oxide (such as cupric oxide) that provides electrical insulation and thermal conduction, the electrical insulation preventing electrical conduction to the base 502 though the conductive layer. Likewise, one or more surfaces of the base 502 could be treated or anodized to provide electrical insulation while preserving thermal conductivity. For example, aluminum oxide can be formed on the top surface 515 and/or the side surfaces 506.

An additional or alternative modification concerns providing a second dielectric layer similar to the second dielectric layer 484 discussed herein in the LED Chip Mounted Above Two Dielectric Layers section. The second dielectric layer can be provided on the bottom surface 550 of the base 502. An additional dielectric layer could be formed on top of the single dielectric or conductive layer referenced above to electrically separate the LED second electrical contact 564 from the LED first electrical contact 562. The void 540 could be eliminated if a dielectric layer is provided between the second electrical contact 564 and the LED first electrical contact 562.

LED Chip Having One and Partially Two Dielectric Layers

Figure 6A:
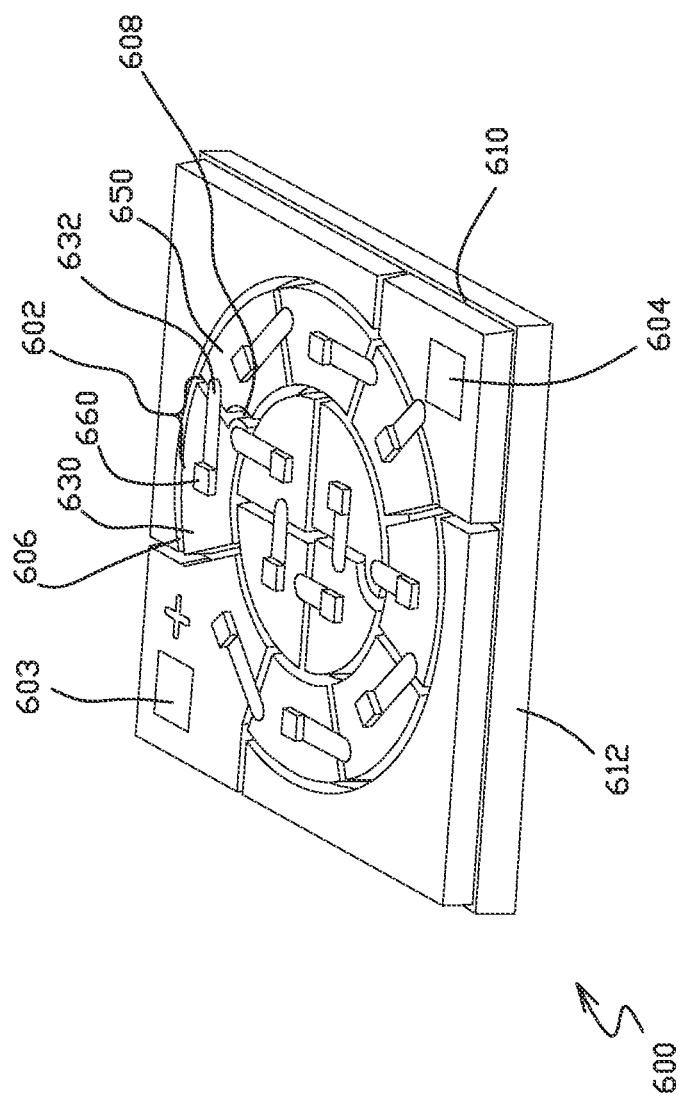
FIGS. 6A and 6B are isometric and front crossectional views of a flip chip LED array package having multiple heat flow pathway configurations.
Figure 6B:
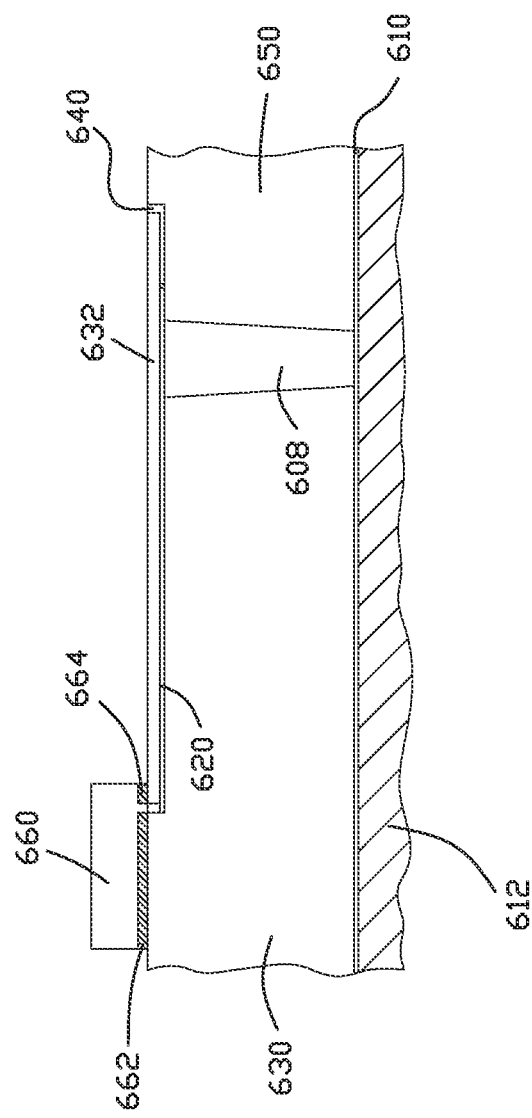

Various embodiments presented herein demonstrate a primary thermal conductively path away from an LED chip that flows through a dielectric and then a metal base. In these embodiments, most of the thermal energy generated by the LED chip flows through this single path. Various other embodiments, however, concern multiple thermal conductive paths through multiple metal masses, the masses functioning similarly as bases as described herein. FIGS. 6A-B show an embodiment where for each of a plurality of LED chips, heat generated by the chip flows though multiple metal masses (islands) on which the LED chip is mounted. Furthermore, the multiple heat pathways for each LED chip have different structural configurations therealong to route the heat along different pathways in different manners.

FIG. 6A shows an isometric view of an LED package system 600. The LED package system 600 includes twelve LED chips, however a LED package configured to accommodate a greater or lesser number of LED chips is contemplated as well. Each LED chip in the illustrated embodiment is a flip chip-type LED, however other types of LED chips can be alternatively used. Each LED chip is part of a LED assembly, such as LED assembly 602. Each LED assembly spans over multiple islands. The LED package system 600 is shown to have 15 distinct islands. Each island can be a metal mass that functions as a heat sink and pathway to conduct heat away a respective LED chip. Each island is about 1 mm tall, measured from the base dielectric layer 610 on the bottom of the LED package system 600 to a top surface of the island, however other dimensions are contemplated. The islands are separate and do not contact one another such that they are electrically isolated from one another. The islands are arrayed along a common plane in FIG. 6A. The islands are separated from one another laterally along the plane by gaps. For example, island 630 is separated from island 650 by gap 608 between the islands. A circular gap 606 can also extend around and/or in between islands. In various embodiments, the gaps can be filled with an electrically insulative material (not shown).

Each of the islands can serve as an electrical conductor that is part of the electrical conduction circuit that powers the LED chips, as further discussed herein. A base dielectric layer 610 is attached to a bottom surface of each of the islands. A LED package base 612 is attached to the bottom of the base dielectric layer 610. The LED package base 612 can protect the dielectric layer 610 and/or serve as a heat sink to conduct heat away from the LED package system 600. The LED package base 612 can be a metal substrate (e.g., copper or aluminum). The base dielectric layer 610 can be the sole dielectric layer between the islands (which are part of the electrical path powering the LED chips) and the thermally conductive substrate external to the LED package system 600. The LED package base 612 can further protect the base dielectric layer 610 from damage that might occur during additional manufacturing steps or handling.

The LED chips are powered by applying a power supply to the anode terminal 603 and the cathode terminal 604. In some embodiments, all of the LED chips are electrically connected in series so that the total supplied current passes through each LED chip. Alternatively, some or all of the LED chips can be electrically connected in parallel. In various other embodiments, one, multiple, or all of the LED chips are part of different electrical circuits.

FIG. 6B is a cross section along the LED assembly 602 of FIG. 6A. The LED chip 660 has a first electrical contact 662 and a second electrical contact 664, electrically isolated from the first electrical contact 662, on the bottom side of the LED chip 660. The first electrical contact 662 can serve as one of an anode or cathode terminal for the LED chip 660 while the second electrical contact 664 can serve as the other of the anode or cathode terminal for the LED chip 660. As shown, the first electrical contact 662 is larger than the second electrical contact 664. The first electrical contact 662 can have a larger footprint (i.e. downward facing surface of the bottom of the LED chip 660) than the second electrical contact 664. The first electrical contact 662 can have a greater mass of conductive metal than the second electrical contact 664. In some embodiments, the first electrical contact 662 can make up a majority of the total mass of the LED chip 660. The first electrical contact 662 is in contact with the top surface of the island 630 and therefore the island 630 and the first electrical contact 662 are electrically connected. In some embodiments, solder, electrically conductive adhesive, or other conductive coupler can be provided to electrically and mechanically connect the first electrical contact 662 with the island 630. The second electrical contact 664 is in contact with conductive layer 632. Conductive layer 632 can be a trace formed from metal (e.g., copper) or other conductive material. The conductive layer 632 is substantially thinner than the island 630. As shown in FIG. 6B, the conductive layer 632 can extend along a step forming on the top of the island 630 such that a top surface of the conductive layer 632 and a top surface of the island 630 are aligned (e.g., co-planar) to allow the LED chip 660 to be flatly mounted on each surface. The conductive layer 632 and the second electrical contact 664 are electrically connected. In some embodiments, solder, electrically conductive adhesive, or other conductive coupler can be provided to electrically and mechanically connect the second electrical contact 664 with the conductive layer 632. A dielectric layer 620 is disposed between the conductive layer 632 and the island 630. The dielectric layer 620 electrically separates the conductive layer 632 from the island 630.

As shown, the conductive layer 632 extends between multiple islands. The dielectric layer 620 also extends between multiple islands, however in various other embodiments the dielectric layer 620 may be limited contacting just the island 630 that is underneath the LED chip 660. The LED assembly 602 extends between islands 630 and 650, spanning the gap 608 therebetween. The conductive layer 632 can contact the island 650 to electrically connect with the island 650 for powering the LED chip mounted thereon. For example, the dielectric layer 620 may not extend over the entirely of the bottom surface and/or side surfaces of the conductive layer 632. Other means for electrically connecting the conductive layer 632 and the island 650 can additionally or alternatively be utilized, such as spot welding the conductive layer 632 overlapping the island 650 or joining a top or side surface of the conductive layer 632 to the top or side surface of the island 650 with an electrically conductive adhesive. For example, the gap 640 between the conductive layer 632 and the island 650 can be filled with electrically conductive adhesive or other electrically conductive material. However, in some other embodiments, the conductive layer 632 can be electrically isolated from the island 650.

Most of the heat generated by the LED chip 660 will be conducted away from the LED chip 660 through the first electrical contact 662 and the second electrical contact 664. Unlike several of the previously disclosed embodiments, the heat conducted through the first electrical contact 662 and the second electrical contact 664 will take different paths that are configured differently. Additionally, the LED assembly 602 is configured such that substantially different amounts of heat can be conducted through the two different heat pathways, as further discussed herein. As such, the LED assembly 602 includes a primary heat pathway and a secondary heat pathway, wherein less resistance to heat transfer is present along the primary heat pathway as compared to the secondary heat pathway, and more heat flows through the primary heat pathway than the secondary heat pathway during operation of the LED chip 660.

The primary heat pathway includes the first electrical contact 662, as part of the LED chip 660, where the heat flows directly between the first electrical contact 662 and the island 630 and then through the base dielectric layer 610 to the LED package base 612. The secondary heat pathway includes the second electrical contact 664, as part of the LED chip 660, where the heat flows directly between the second electrical contact 664 and the conductive layer 632, then through the dielectric layer 620 to the island 630 and then through the base dielectric layer 610 to the LED package base 612. A single dielectric layer (the base dielectric layer 610) is in the path of the primary heat pathway between the LED chip 660 and the LED package base 612, while two dielectric layers (the base dielectric layer 610 and the dielectric layer 620) are in the path of the secondary heat pathway between the LED chip 660 and the LED package base 612. While the base dielectric layer 610 is in the heat pathway of essentially all downward conducted heat from the LED chip 660 (i.e. the primary heat pathway and the secondary heat pathway), the dielectric layer 620 is only partially along the heat pathway of the downward conducted heat from the LED chip 660 (i.e. the secondary heat pathway).

Generally, an LED package that maximizes the vertical distance of the island height (i.e. base thickness) between the LED chip and any dielectric material within a heat pathway has the potential to significantly improve both lateral and vertical heat spreading before significant thermal resistance is encountered at the dielectric material. This heat spreading effect results in heat dissipation over a larger substrate mass and results in a lower LED operational or junction temperature of the LED chip. Placing a dielectric material closer to the bottom of the LED package system 600, where the heat flux is less concentrated, reduces temperature gradients within the LED package system 600 and allows for common and cost effective dielectrics to be utilized, such as polyimide or silicone, instead of higher thermal performance materials. Such dielectrics typically have a thermal conductivity an order of magnitude lower than metal components, such as the islands. In the case of the LED assembly 602, heat flowing through the primary heat pathway must travel further (e.g., down the entire island 630) before any dielectric layer (i.e. base dielectric layer 610) is encountered while heat being transferred through the secondary heat pathway travels a lesser distance before encountering any dielectric layer (i.e. dielectric layer 620). The longer distance between the first electrical contact 662 and the base dielectric layer 610 as compared the distance between the second electrical contact 664 and the dielectric layer 620 increases thermal performance because the heat can spread out to a greater degree laterally and vertically before encountering any dielectric layer along the first heat pathway.

The LED chip 660 can take advantage of the reduced resistance to thermal flow along the primary path by having the first electrical contact 662 be larger in footprint and/or mass than the second electrical contact 664 so that more heat is conducted to the primary heat pathway, that is more permissive to heat flow, than the secondary heat pathway, which is less permissive to heat flow.

Each of the islands and LED chip assemblies of the LED package system 600 can be configured similarly to that of island 630 and LED assembly 602. In this way, electrical power can be conducted from island to island by conducted traces bridging between the islands. The LED chips can be connected in series in this or in another manner.

Figure 7:
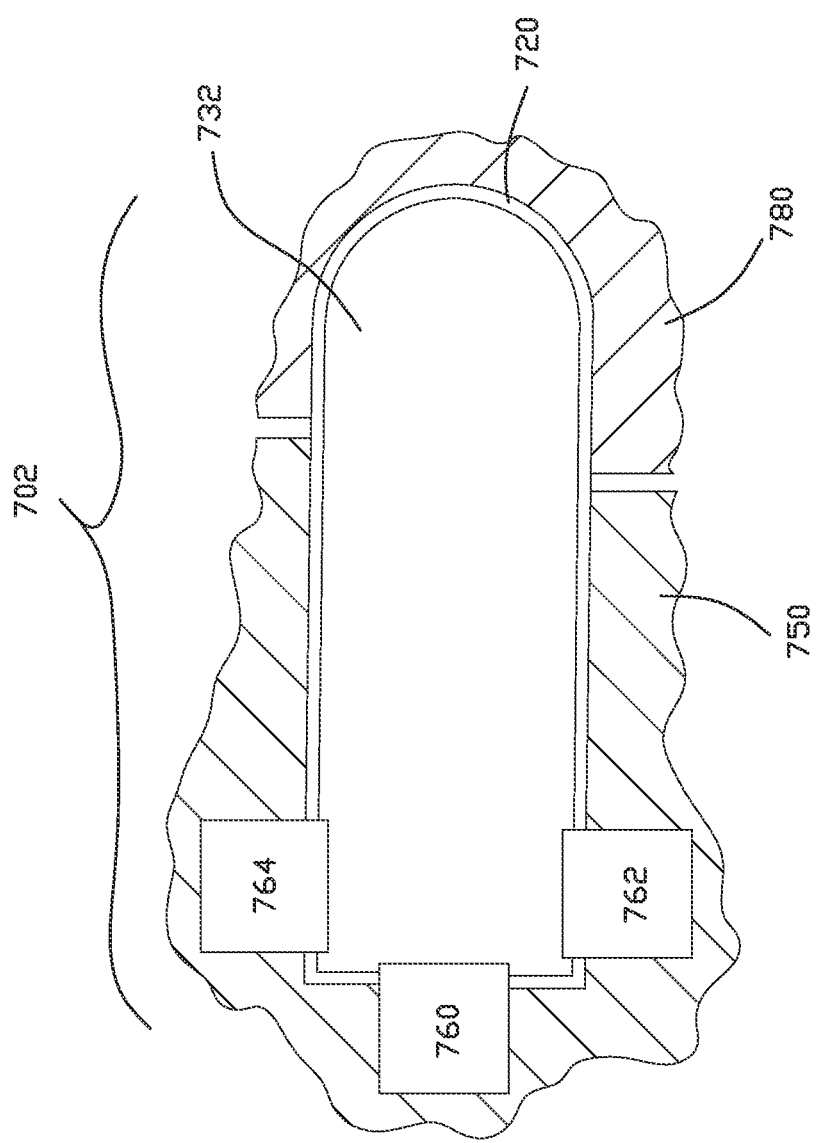
FIG. 7 is the top view of three flip chip LEDs mounted on an electrical circuit assembly.

While the LED chips of the embodiment of FIG. 6A are shown in series connection, parallel circuit arrangements are also contemplated. A design configuration in which multiple LED chips are mounted in parallel on a single or multiple islands has the advantage of allowing current to continue to flow if one or more LED chips fail to conduct current. FIG. 7 illustrates an overhead view of an electrical circuit assembly 702 that has three LED chips 760, 762, and 764 each having a first electrical contact (e.g., cathode contact) connected to a conductive trace 732 and a second electrical contact (e.g., anode contact) connected to an island 750 (e.g., an island as described in connection with FIGS. 6A-b). The conductive trace 732 can extend to another island 780 to make a series electrical connection with more LED chips in a manner similar to the embodiment of FIGS. 6A-B. A dielectric material 720 electrically separates the first electrical contacts of the LED chips from the second electrical contacts. The circuit assembly 702 can be mounted in a similar manner as the LED assembly 602 of FIGS. 6A-B.

Although the invention has been described with reference to certain embodiments, those skilled in the art will recognize that changes can be made in form and detail without departing from the spirit and scope of the invention.

What is claimed is:
1. A LED package, the LED package comprising:
a metal base, the base having a top side and a cavity formed within the base on the top side, the cavity sunken below the top side, the cavity comprising a bottom surface;
a flexible circuit comprising a bottom insulation layer, a first conductive trace layer above the bottom insulation layer, a second conductive trace layer above the bottom insulation layer, a top insulation layer on the first and second conductive trace layers having voids to expose top portions of both the first and second conductive trace layers, the bottom insulation layer adhered to the metal base, the bottom insulation layer having void sections to expose portions of both the first and second conductive trace layers, wherein a first exposed portion is between the first conductive trace and the metal base and a second exposed portion is between the second conductive trace and the metal base, the bottom insulation layer formed from a first type of material;

a dielectric layer within the cavity between the first exposed portion of the first conductive trace layer and the metal base and between the second exposed portion of the second conductive trace layer and the metal base, the dielectric layer formed from a second type of material, the second type of material having higher thermal conductivity than the first type of material; and an LED chip, the LED chip having a bottom side facing the bottom surface of the cavity and a first electrical contact, the first electrical contact connected to the first conductive trace layer;

wherein the LED chip is powered by current flowing between the first conductive trace layer and the first electrical contact, and heat generated by the LED chip is conducted from the first electrical contact to the base through the dielectric layer.

2. The LED package of claim 1, wherein a majority of the thermal energy generated within the LED chip flows into the base through the dielectric layer.

3. The LED package of claim 1, further comprising a standoff element within the cavity between the flexible circuit and the bottom surface, the height of the standoff element about equal to the thickness of the dielectric layer.

4. The LED package of claim 3, wherein the standoff element is a strip that extends from a first edge of the bottom surface to a second edge of the bottom surface opposite the first edge.

5. The LED package of claim 1, further comprising a reflective layer deposited on a top layer of the flexible circuit within the cavity.

6. The LED package of claim 1, wherein the LED chip is entirely within the cavity such that the LED chip does not protrude above the top side of the base.

7. The LED package of claim 1, wherein the base is at least about 1 millimeter thick and the cavity is at least about 250 microns deep.

8. The LED package of claim 1, wherein:
the dielectric layer is adhered to the bottom side of the first and second conductive trace layers.

9. The LED package of claim 1, wherein the cavity in the base is formed by stamping.

10. The LED package of claim 1, wherein the dielectric layer comprises a ceramic or diamond filled substrate having low electrical conductivity and high heat conductivity.

11. The LED package of claim 1, wherein the cavity is filled with a transparent material that encapsulates the LED chip, the transparent material conditioning the color of light as the light emanates from the LED chip and out of the LED package.

12. The LED package of claim 1 wherein the cavity further comprises a ramped surface extending between the top side and the bottom surface.

13. The LED package of claim 12 wherein the bottom insulation layer of the flexible circuit is adhered to the ramped surface.

14. The LED package of claim 13 wherein the LED chip is within the cavity.

15. The LED package of claim 1, wherein the LED chip further comprises: a second electrical contact, the second electrical contact connected to the second conductive trace layer.

* * * * *